United States Patent [19]

Cantou

[11] Patent Number: 4,476,438
[45] Date of Patent: Oct. 9, 1984

[54] MULTIPLIER CIRCUIT INCLUDING AMPLIFIER WITH DRIFT COMPENSATION CIRCUIT

[75] Inventor: Christian Cantou, Combs-la-Ville, France

[73] Assignee: U.S. Philips Corporation, New York, N.Y.

[21] Appl. No.: 315,845

[22] Filed: Oct. 28, 1981

[30] Foreign Application Priority Data

Nov. 3, 1980 [FR] France .................................. 80 23468

[51] Int. Cl.³ ............................ H03F 1/26; H03F 1/34
[52] U.S. Cl. ..................................... 330/149; 330/86; 330/9
[58] Field of Search .................. 330/149, 86, 260, 293, 330/9

[56] References Cited

U.S. PATENT DOCUMENTS

4,229,703 10/1980 Bustin ...................................... 330/9
4,360,787 11/1982 Galpin ................................. 330/284

Primary Examiner—James B. Mullins
Assistant Examiner—G. Wan
Attorney, Agent, or Firm—Robert T. Mayer; Bernard Franzblau

[57] ABSTRACT

An amplifier circuit comprising an amplifier (1) having an input (11) which receives an electric signal comprising an intermittent useful signal component $V_U$ and an undesired spurious component $V_D$ and an input (12) of opposite sign to that of the input (11). The output signal of a circuit (2) for the compensation of the spurious component is applied to amplifier input. The circuit (2) comprises a comparator (20) for comparing the undesired component, taken from the output of the amplifier (1), with a threshold value, a counter (21) which is incremented or decremented depending on the result of the comparisons and in the rhythm of a clock circuit (22), and a digital-to-analog converter (23) coupled to the output of the counter (21) to supply the signal for the compensation of the unwanted component to the input (12).

11 Claims, 6 Drawing Figures

MULTIPLIER CIRCUIT INCLUDING AMPLIFIER WITH DRIFT COMPENSATION CIRCUIT

The present invention relates to an amplifier circuit for an electric signal applied to a first amplifier input of a specific sign, which signal comprises an intermittent useful signal component and a slowly varying spurious component. More specifically, the invention relates to a compensation circuit incorporated in the amplifier circuit in order to suppress said spurious component. The invention also relates to multiplier stages including said amplifier circuit, as well as transversal filters equipped with such multiplier stages.

In an amplifier it frequently happens that in the case of a zero input signal a non-zero output signal is produced as a result of drift. In order to eliminate this spurious component from the output signal the following method is frequently applied: the output signal is attenuated suitably and fed back to the input of the amplifier in such a way that it is subtracted from the main input signal or useful signal. It is possible to eliminate the spurious component with the aid of an entirely analog circuit, along with the control problems inherent in such a circuit (see for example U.S. Pat. No. 4,042,885 filed by Charles F. Rhodes, Sun Oil Company, on the Oct. 30, 1975 and published on the Aug. 16, 1977, and specifically the zeroing circuit 18 described in said patent), or in an entirely digital way. This last-mentioned method leads to expensive circuitry because the feedback path should, inter alia, comprise a digital memory, an analog-to-digital converter receiving the output signal from the amplifier, and a digital-to-analog converter which feeds a signal for suppressing the spurious component to the second input of the amplifier.

It is an object of the invention to provide an amplifier circuit in which the spurious-component compensation circuit is of simple and cheap design, while maintaining the advantages of a digital version.

According to the invention an amplifier circuit for an electric signal which comprises an intermittent useful signal component $V_U$ and a spurious component $V_D$ whose amplitude varies at a frequency which is substantially lower than the recurrent frequency of the intermittent signal $V_U$, said electric signal being applied to a first input, of a specific sign, of an amplifier equipped with a spurious-component compensation circuit, characterized in that said spurious-component compensation circuit comprises:

(a) a comparator arranged at the amplifier output for, at least one time during at least one of the intermittence intervals of the intermittent useful signal $V_U$, sampling the amplified spurious component and comparing it with a reference threshold value;

(b) a counter having a first input that receives the output signal of the comparator and which is incremented or decremented depending on the value of said comparator output signal and in the rhythm imposed on it by an associated clock circuit via a second input, in order to supply a digital signal for spurious-component compensation; and (c) a digital-to-analog converter arranged at the output of the counter and adapted to supply the spurious-component compensation signal to a second amplifier input, which is of a sign opposite to that of the first input of specific sign.

Thus, the design adopted for the compensation circuit is in fact that of a step-by-step device in which the contents of a counter are progressively modified in one sense or the other depending on the polarity of the difference between the amplitude of the spurious component and the reference threshold value and in such a way that a kind of adaptive compensation is obtained for the spurious component (by subtracting the analog signal for spurious-component compensation from the electric signal to be amplified, which compensation signal is available at the output of the digital-to-analog converter). Such a design is both comparatively simple and cheap because only one converter is employed and provides easy control because the accuracy of the applied correction depends on the dimensioning (number of bits) of the digital-to-analog converter, on the accuracy of the comparator, and on the rhythm of the comparisons and of the changes produced in the counter as a result of said comparison.

A further object of the invention is to provide a multiplier stage equipped with an amplifier circuit in accordance with the invention in order to provide compensation for drift of the actual multiplier circuit.

To this end the multiplier stage in accordance with the invention is characterized in that the amplifier is preceded by a multiplier circuit which receives at a first input an electric signal comprising an intermittent useful signal $V_U$ and a spurious component $V_D$ and receives at a second input a quantized signal $V_{Qi}$, which varies cyclically and in steps with the index i varying from 1 to N. The multiplier circuit supplies the product signal $V_{Qi}(V_U+V_D)$ to a first input of the amplifier of specific sign. The spurious-component compensation circuit also comprises a difference memory having N locations. This memory is arranged between the output of the counter and the input of the digital-to-analog converter and serves for storing, for each value of the index i and as a function of the value of the comparator output signal, the digital value of the compensation signal associated with said index value and for retaining said digital value at least until a new comparison is made for the same value of the cyclically varying index i. The output of the difference memory is also connected to a third or starting input of the counter.

In a more complex embodiment the multiplier stage may be characterized in that an adder circuit is arranged between the output of the multiplier circuit and the first amplifier input of a specific sign, that the outputs of (M−1) further multiplier circuits are connected to (M−1) further inputs of the adder circuit in a similar way, that each of the M multiplier circuits thus arranged in parallel receives an electric signal at its first input, which signal comprises a useful component $V_{Uj}$ and a spurious component $V_{Dj}$ whose amplitude varies at a frequency which is substantially lower than the intermittence frequency of the corresponding intermittent component $V_{Uj}$, and receives a quantized signal $V_{Qij}$ at its second input, and supplies the product signal $V_{Qij}(V_{Uj}+V_{Dj})$ to the corresponding input of the adder circuit, the indexes i and j respectively varying from 1 to N and from 1 to M and all the components $V_{Uj}$ being interrupted at the same instant. The difference memory of the spurious-component compensation circuit comprises N memory locations which each serve for storing, for the corresponding value of the index i, the digital value of the compensation signal associated with said value of the index i as a function of the value of the comparator output signal. This digital value is retained at least until a new comparison is made for the same value of the cyclically varying index i.

Said multiplier stage, which operates in accordance with the same principle as that which comprises only one multiplier circuit if all the intermittent useful signal $V_{Uj}$ are effectively interrupted at the same instant, finds an interesting application in a time-domain transversal filter, which therefore comprises a network of delay lines. In accordance with the invention said filter is characterized in that it comprises a multiplier stage as defined in the foregoing, in which the electric signals received at the first inputs of the multiplier circuits are the M signals available at the tappings of the delay-line network and the quantized signals $V_{Qij}$ are the M weighting coefficients of the filter which, for each value of the index i, are respectively applied to the corresponding inputs of the M multiplier circuits via a digital-to-analog conversion stage for said weighting coefficients arranged at the output of a coefficient-storage memory, between said memory and the second inputs of the multiplier circuits.

In a simplified embodiment of the filter the conversion stage for the coefficient simply comprises M digital-to-analog converters in parallel and arranged between the output of the coefficient storage memory and the respective M second inputs of the multiplier circuits.

In a more complex variant of the filter in accordance with the invention it is possible to employ circuits, which are identical to the spurious-component compensation circuit, for zero and dynamic adjustment of each of the multiplier circuits during an initial adjustment cycle or during periodically applied cycles.

The filter in accordance with the invention is then characterized in that it comprises M second spurious-component compensation circuits which each comprise a second comparator arranged at the output of the amplifier to enable a comparison of the output signal of said amplifier with a zero threshold value, a second counter, a second clock circuit, a second difference memory and a second digital-to-analog converter, that it further comprises M third spurious-component compensation circuits which each comprise a third comparator, which is also arranged at the output of the amplifier to enable a comparison of the output signal of said amplifier with a threshold value which is identical for all the weighting coefficients of the filter and is determined by the desired dynamic behaviour of each multiplier circuit, a third counter, a third clock circuit, a third difference memory and a third digital-to-analog converter, that the M digital-to-analog converters of the weighting-coefficient conversion stage are multiplying converters in each of which the zeroing input and the analog input are respectively connected to the output of that of the M second compensation circuits and to the output of that of the M third compensation circuits which are associated therewith, of which the digital input is connected to the output of the weighting-coefficient memory and of which the output, at which an analog signal appears which is the product of the signals appearing on the analog and digital inputs, is connected to the second input of that of the M multiplier circuits which is associated with said converter, and that a control element is associated with the M second and M third compensation circuits for starting the zeroing and dynamic control cycles of each of the multiplier circuits.

A second variant of the filter in accordance with the invention comprises an interface and demultiplexing circuit, whose arrangement between a single digital-to-analog converter (arranged at the output of the weighting-coefficient memory) and the M multiplier circuits enables the construction of said filter to be smplified considerably. Indeed, the presence of said interface and demultiplexing circuit makes it possible to use only one second and one third spurious-component compensation circuit (respectively for zeroing and for controlling the dynamic behaviour of the multiplier circuits) instead of the 2M circuits in the preceding embodiment.

In a third variant of the embodiment a fast transversal filter can be obtained by combining two transversal filters in accordance with one of the preceding embodiments. Thus, instead of the filter being inoperative during each of the adjustment cycles, it is now possible to control an adjustment cycle of one of said filters during normal operation of the other filter and vice versa.

The characteristic features and advantages of the invention will become more apparent from the following description and the accompanying drawings, which are given by way of non-limitative example, and in which.

The amplifier circuit in accordance with the invention and described with reference to FIG. 1 comprises an amplifier 1 having a first input 11 (in this case positive or non-inverting) that receives an electric signal comprising a useful intermittent signal component $V_U$ and a spurious component $V_D$, which in the present case is the amplifier drift. The drift is inherently slow and in this case exhibits an amplitude variation at a frequency which is substantially lower than the recurrent frequency of the useful intermittent signal $V_U$. Associated with said amplifier 1 is, in accordance with the invention, a circuit 2 for the compensation of the spurious component $V_D$, which circuit comprises a comparator 20, a counter 21, a clock circuit 22 and a digital-to-analog converter 23.

In the circuit 2 the comparator 20 is arranged at the output of the amplifier 1 in order to take off the amplified spurious component during the intermittence intervals of the intermittent useful signal $V_U$ and subsequently compare it with a reference threshold value, which is zero in the present case. The counter 21 receives the output signal of the comparator 20 at a first input 21a and the control signal supplied by a clock circuit 22 at a second input 21b. In response to said control signal and in the rhythm defined by the frequency of said signal the contents of the counter 21 are incremented or decremented by one quantization step during each of the sampling periods thus defined by the clock circuit 22. Incrementation or decrementation is dependent on the sign of the difference between the undesired component $V_D$ and the reference threshold value (incrementing being for example applied if the signal is positive and decrementing in the opposite case). Finally, the digital-to-analog converter 23 is arranged at the output of the counter 21 in order to receive the digital spurious-component compensation signal supplied by said counter, and to supply said compensation signal in analog form to a second input 12 of the amplifier 1, the sign of said input being opposite to that of the first input 11 (that is, negative or inverting in the present case).

The analog signal for compensation of the spurious component thus generated is subtracted from the signal appearing at the input 11 of the amplifier 1 in order to suppress or substantially reduce the effect of the drift of said amplifier. In fact, it is evident that the accuracy of such a correction and its error correction speed depend on the rhythm of operation imposed by the clock circuit 22. The compensation of the spurious component $V_D$ will become more effective as the number of control signals supplied by the clock signal during an inter-mittence interval of the intermittent useful signal VU increases.

Figure 2:
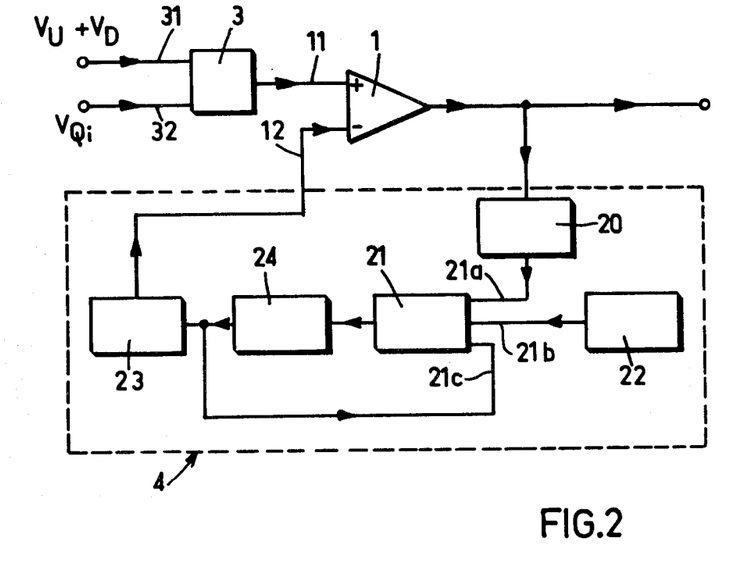
FIGS. 2 and 3 show two examples of multiplier stages comprising an amplifier circuit in accordance with the invention.

The amplifier circuit just described may be incorporated in a multiplier stage such as the one shown in FIG. 2. In that case the amplifier 1 is preceded by a multiplier circuit 3 which, at a first input 31, receives an electric signal comprising a useful intermittent signal component $V_U$ and a spurious component $V_D$ to be suppressed and, at a second input 32, receives a quantized signal $V_{Qi}$, whose index i varies from 1 to N in a cyclic manner (that is periodically assumes the same values when the cycle is completed) and in steps (which means that for a specific value of i the corresponding signal $V_{Qi}$ remains constant). The product signal $V_{Qi} \times (V_U + V_D)$ supplied by the multiplier circuit 3 is fed to the first input 11 of the amplifier 1.

Figure 1:
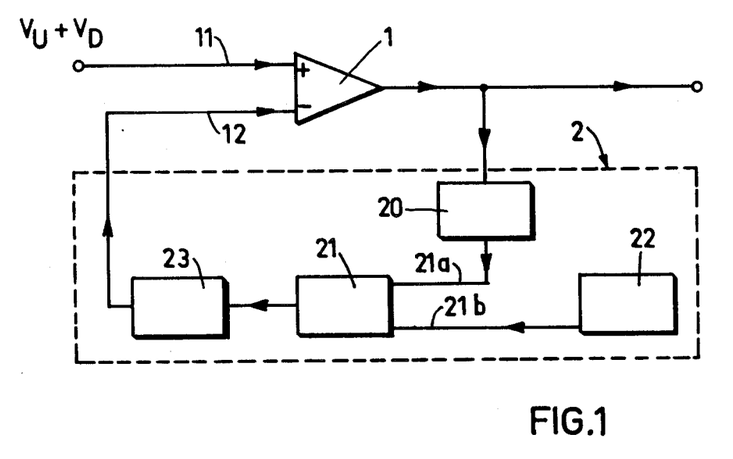
FIG. 1 shows an example of a signal amplifier circuit in accordance with the invention.

Moreover, the spurious-component compensation circuit which is now referenced 4, comprises, in addition to the elements 20 to 23 of FIG. 1, a difference memory 24, arranged between the output of the counter 21 and the input of the digital-to-analog converter 23. Said memory 24 is adapted to supply, for each value of the index i, the digital value of the associated compensation signal which, for each control signal supplied by the clock signal 22, is determined by the result of the comparison effected by the comparator 20 and by the corresponding modification of the contents of the counter 21. This storage should continue at least until a new comparison is made for the same value of the cyclically varying index i, and, at the instant at which the index i resumes the same value, via a connection between the output of the difference memory 24 and the third input 21c of the counter 21, the counter receives the value which the digital compensation signal had during the preceding passage of the index i through said same value. Thus, for the same value of the index i, despite corrections which in the meantime are applied to the other values of i, the successive corrections are added to each other to obtain total compensation for the spurious component $V_D$ and at a speed which depends on the clock frequency.

Figure 3:
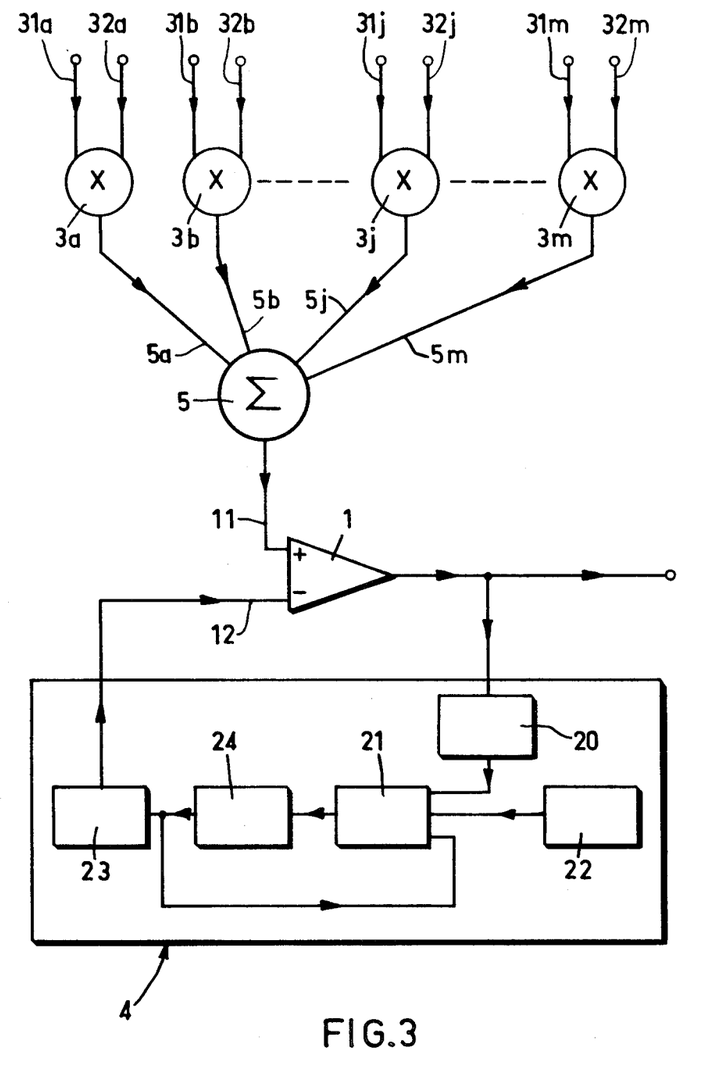

In a more complex embodiment shown in FIG. 3 the multiplier stage comprises M multiplier circuits 3a to 3m arranged in parallel and receiving, at their first inputs 31j (the index j varying from 1 to M), an electric signal comprising a spurious component $V_{Dj}$ whose amplitude varies at a frequency which is substantially lower than the intermittence frequency of the corresponding useful intermittent signal $V_{Uj}$ and, at their second inputs 32j a quantized signal $V_{Qij}$ (i varying from 1 to N). Each product signal $V_{Qij} \times (V_{Uj} + V_{Dj})$ supplied by the corresponding multiplier circuit 3j is applied to the corresponding first input 5j of an adder circuit 5 arranged between said M parallel multiplier circuits 3a to 3m and the first input 11 of the amplifier 1. Between the output of the amplifier 1 and its second input 12 the spurious-component compensation circuit 4 is arranged, which circuit comprises the same elements 20 to 24 as shown in FIG. 2. The memory 24 of said circuit 4 should comprise N storage locations each of which store the digital value of the compensation signal associated with each value of i, at least until a new comparison is made for the same value of the cyclically varying index i.

The multiplier stage just described operates in accordance with exactly the same principle as that of FIG. 2, provided that the total spurious component present at the output of the amplifier 1 can be sampled in an effective manner. For this it is necessary that, at least during a certain time interval which suffices to enable said sampling, all the intermittent useful signals $V_{Uj}$ are simultaneously zero.

An important application of the multiplier stage of FIG. 3 is described with reference to FIG. 4, which represents a transversal filter of the time-domain type. Said filter comprises a network of (M−1) delay lines 40b to 40m, a multiplier stage as shown in FIG. 3 (and comprising the same elements), a memory 41 for storing the weighting-coefficients of the filter, and a digital-to-analog conversion stage for said coefficients arranged between said memory 41 and the multiplier circuits 3a to 3m of the multiplier stage. In the present embodiment the digital-to-analog conversion stage for the coefficients comprises M digital-to-analog converters 42a to 42m arranged in parallel after the memory 41, the output of each of said converters being connected to the second input of the corresponding one of the M multiplier circuits (the output of the converter 42a is connected to the second input 32a of the multiplier circuit 3a etc.).

The signals received at the second inputs 32a to 32m for each value of the index i therefore constitute the quantized signals $V_{Qij}$ by which the intermittent useful signals $V_{Uj}$ applied to the first inputs 31a to 31m of the circuits 3a to 3m should be multiplied by the network of delay lines 40b to 40m (the signals $V_{Uj}$ are the M signals available on the M tappings of the network of (M−1) delay lines). The circuit 4 for the compensation of the spurious component (which is identical to the preceding one and is therefore not shown in detail) of the multiplier stage, as in the foregoing, provides total compensation for the drift in the multiplier circuits 3a to 3m and the amplifier 1, provided once again that the spurious component can be sampled effectively (which is possible if all the signals $V_{Uj}$ can be zero simultaneously).

In a first variant of the transversal filter just described, said filter may comprise further spurious-component compensation circuits. When considering the filter shown in FIG. 4, the digital-to-analog converters 42a to 42m are conventional converters. By replacing them by digital-to-analog converters of the multiplying type, it is possible to provide a separate spurious-component compensation circuit for the analog input and the zeroing input of each of said multiplying converters, as will be explained hereinafter.

Figure 4:
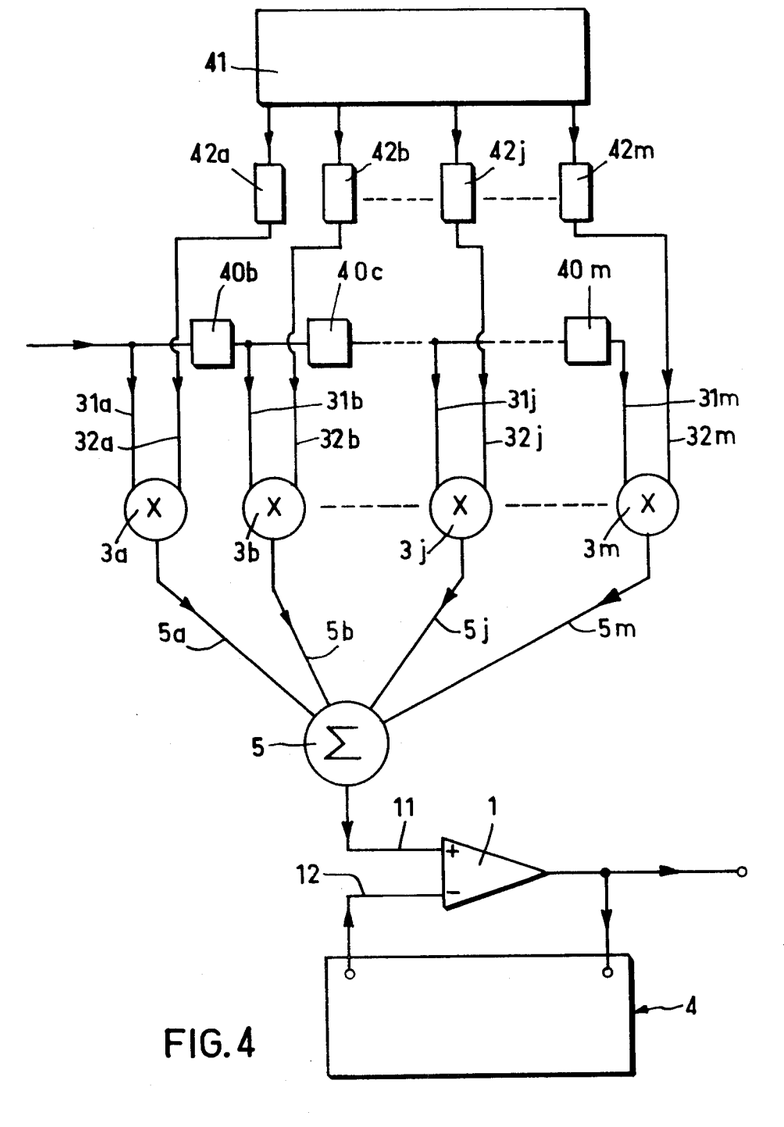
FIGS. 4 to 6 show three examples of transversal filters equipped with multiplier stages comprising an amplifier circuit in accordance with the invention.
Figure 5:
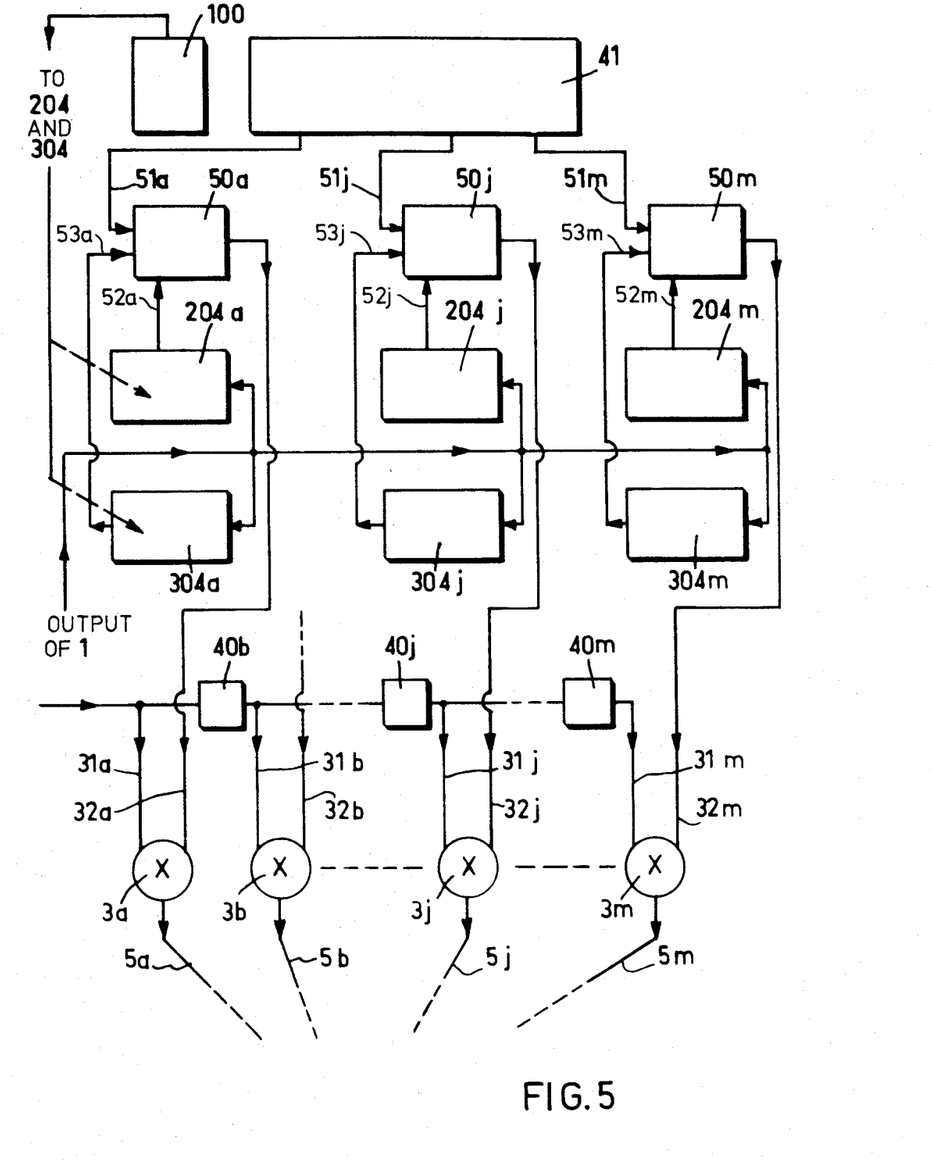

FIG. 5, with reference to which this preceding variant will be described, contains all the elements of FIG. 4, except those which are typical of the variant in question, namely the digital-to-analog converters arranged at the output of the memory 41 for the storage of the weighting-coefficients of the filter, which converters are now replaced by M multiplying digital-to-analog converter 50a to 50m arranged in parallel after said memory 41. In order to simplify said FIG. 5, the elements after the multipliers $3a$ to $3m$, which are the same as in FIG. 4, are not shown. The outputs of said converters $50a$ to $50m$, on which the analog product signals of the signals present on their analog and digital inputs are available, are respectively connected to the second inputs $32a$ to $32m$ of the multiplier circuits $3a$ to $3m$. The digital inputs $51a$ to $51m$ of each of said multiplying converters are each connected to a corresponding output of the memory 41. In addition to the elements of FIG. 4 the transversal filter of FIG. 5 comprises M second spurious-component compensation circuits, referenced $204a$ to $204m$, and each comprising, when j is each time the current index associated with each of the filter channels, a second comparator $220j$ arranged at the output of the amplifier 1 in order to enable a comparison of the output signal of said amplifier with a zero threshold value, a second counter $221j$, a second clock circuit $222j$, a second difference memory $224j$ and a second digital-to-analog converter $223j$ (said elements $220j$ to $224j$, which are identical to the elements 20 to 24 of the circuit 4, are therefore not shown).

A control element 100 is associated with said series of M second circuits $204a$ to $204m$ for starting an automatic zeroing cycle during the periods in which the filter is not used or before they are going to be used. Said cycle is as follows: by applying a suitable signal to the input of the transversal filter a unit voltage $V_{Uj}$ is applied to the first input $31j$ of each of the multiplier circuits $3a$ to $3m$. When one of the weighting coefficients applied to the second input $32j$ of said circuit is zero, a signal which is also zero should be obtained at the output of the multiplier circuit $3j$. If this requirement is not met for a specific circuit $3j$, the difference found is eliminated by means of the spurious-component compensation circuit $204j$ associated with said incorrectly adjusted multiplier circuit. The operation of the circuits $204a$ to $204m$ is the same as described in the foregoing: the consecutive comparisons of the output signal of the amplifier 1, after a step-by-step incrementation or decrementation of the counter, give rise to a digital signal for suppressing the unwanted component, which after having been converted into analog form is applied to the zeroing input $52j$ of the multiplying converters $50j$ of the channel j of the transversal filter. The analog output signal of the circuit $204j$ for the compensation of the unwanted component is such that the output signal of the multiplying circuit $3j$ is now zero when the corresponding weighting coefficient, supplied by the memory 41, is zero.

The transversal filter of FIG. 5 finally comprises, again in addition to the elements of FIG. 4, another series of M third spurious-component compensation circuits, referenced $304a$ to $304m$. In the same way as the circuits 4 and $204a$ to $204m$, said circuits $304a$ to $304m$ each comprise, j being the current index associated with each of the filter channels, a second comparator $320j$ arranged at the output of the amplifier 1 in order to enable a comparison of the output signal of said amplifier with an identical threshold value for all the weighting coefficients of the filter, which threshold value is determined by the desired dynamic behaviour of each multiplier circuit $3j$, a third counter $321j$, a third clock circuit $322j$, a third difference memory $324j$, and a third digital-to-analog converter $323j$ (as in the foregoing, said elements $320j$ to $324j$, which are identical to those in the circuit 4 and the circuits $204a$ to $204m$, are not shown).

In the same way as for the M second compensation circuits $204a$ to $204m$ the control element 100 serves to start, in general after a zeroing sequence with the aid of the circuits $204a$ to $204m$ and always during the periods in which the filter is not used or before it is going to be used, a second automatic control cycle, i.e. a cycle for controlling the dynamic behaviour. If a known signal is applied to the input of the filter, for which the response of this filter is known, the amplitude of the weighting coefficient can be corrected in such a way that effectively said value is obtained. The purpose of the dynamic control is therefore to obtain, for a known input signal of the filter, a signal of a predetermined amplitude at the output of each of the multiplier circuits $3a$ to $3m$ when the corresponding weighting coefficients are normalized at the value 1. For any difference relative to said signal of predetermined amplitude the corresponding undesired component can be suppressed by means of the compensation circuit $304j$.

The operation of the compensation circuits $304a$ to $304m$ is similar to that of those described in the foregoing: consecutive comparisons of the output signal of the amplifier 1, after stepwise incrementation or decrementation of the counter, give rise to a digital signal for the compensation of the undesired component which, after conversion into an analog form, is applied to the analog input $53j$ of the multiplying converter $50j$ of the channel j of the transversal filter. The analog output signal of the spurious-component compensation circuit $304j$ is such that now the dynamic behaviour of the output signal of the multiplier circuit $3j$ is correctly adjusted in accordance with the indications given in the foregoing. The same process is adopted for each channel j of the filter by consecutively making each weighting coefficient equal to the normalized value 1 and at the same time cancelling all the other coefficients.

Figure 6:
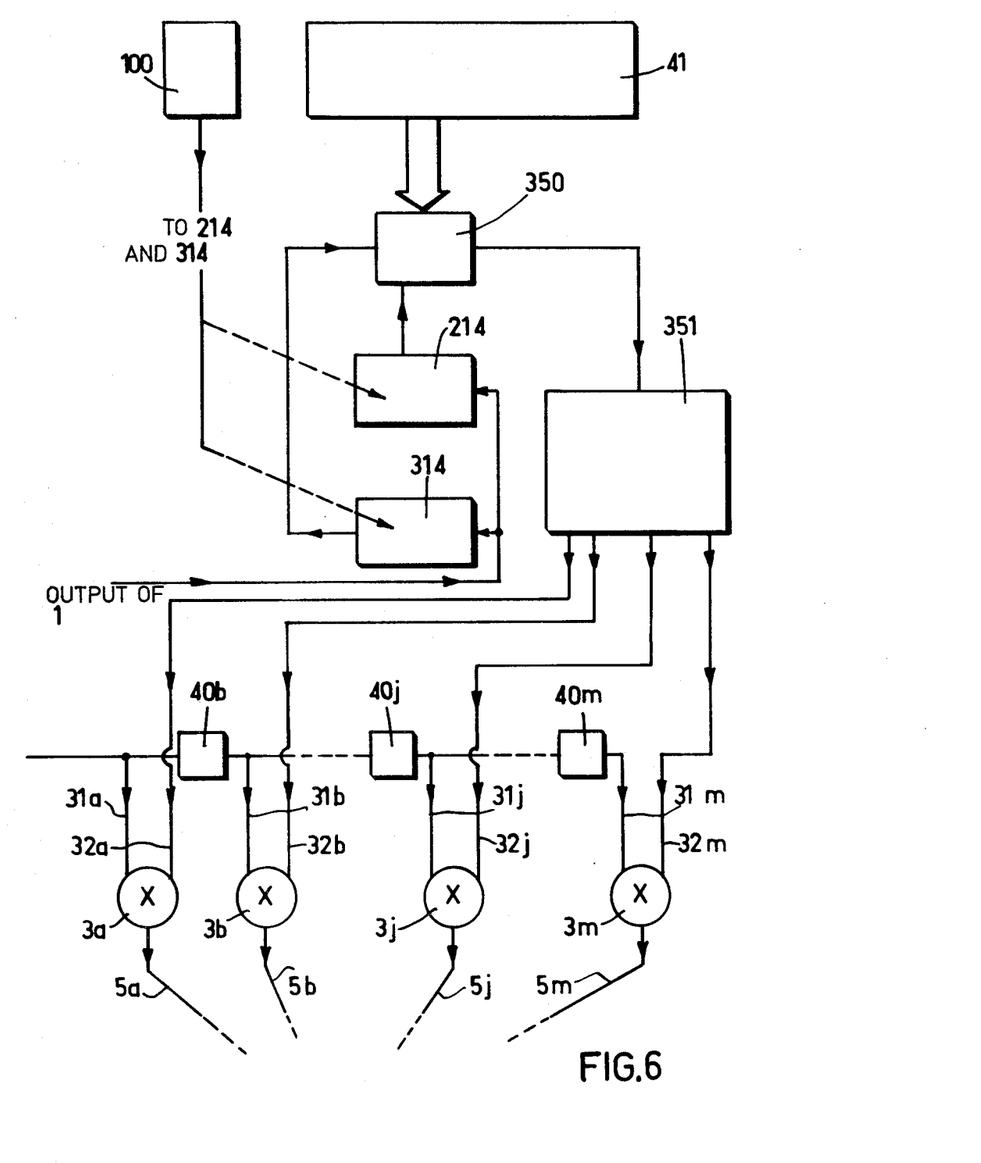

A second variant of the filter of FIG. 5, which will be described with reference to FIG. 6, is possible in which the M second and the M third compensation circuits provided in the foregoing are replaced by a single second and a single third spurious-component compensation circuit 214 and 314 respectively, which are associated with a single multiplying digital-to-analog converter 350 and an interface and demultiplexing circuit 351.

The second and third spurious-component compensation circuits 214 and 314 have a structure which is identical to those of the M second and M third circuits $204a$ to $204m$ and $304a$ to $304m$ respectively, and which is therefore not described in more detail. The zeroing input and the analog input of the multiplying converter 350 are respectively connected to the output of the second and the output of the third spurious-component compensation circuits 214 and 314, while its digital input receives the multiplexed output from the memory 41 which stores the weighting coefficients. The output of said converter 350, on which the product signal of the signals at the analog and digital inputs is present, is connected to the input of the interface and demultiplexing circuit 351 which comprises M outputs which are each connected to the respective second input of one of the M multiplier circuits $3a$ to $3m$. As in the foregoing, the control element 100 starts the automatic zeroing and dynamic control cycles of the converter 350 at the desired instants.

The advantage of the circuit 351 is evident: the complexity of the circuit is considerably reduced relative to the embodiment of FIG. 5 because it employs only two spurious-component compensation circuits instead of 2M, the weighting coefficients being routed to the appropriate multiplier circuits by means of the circuit 351. Such interface and demultiplexing circuits are known and will not be described in more detail. In this respect reference is made to the circuit shown in FIG. 2 of the article by P. B. Denyer, J. Mavor and J. W. Arthur "Miniature programmable transversal filter using CCD/MOS technology", published in the Proceedings of the IEEE, Vol. 67, No. 1, January 1979, pages 42 to 50.

Of course, the present invention is not limited to the embodiments described and shown here, to which further variants are possible without departing from the scope of the invention.

For example, in accordance with the invention, two transversal filters as described in detail in the foregoing may be arranged in parallel in order to realize a fast transversal filter. The combination thus obtained is ready for operation at any instant because, owing to the parallel arrangement, a control cycle (zeroing and dynamic control) for one of the filters may be started during a normal cycle of operation of the other filter and vice versa.

What is claimed is:

1. A compensated multiplier stage comprising a multiplier circuit having a first input for receiving an electric signal comprising an intermittent useful signal $V_U$ and a spurious component $V_D$ and a second input for receiving a quantized signal $V_{Qi}$ which varies cyclically and in steps with the index i of the signal $V_{Qi}$ varying from 1 to N, an amplifier having an output and first and second inputs of opposite sign, said multiplier circuit having an output supplying the product signal $V_{Qi}(V_U+V_D)$ to the first input of the amplifier, a negative feedback circuit coupled between the amplifier output and the second input of the amplifier, said negative feedback circuit comprising; a comparator having an input coupled to the output of the amplifier for comparing the spurious component $V_D$ with a reference signal at recurrent time intervals when the useful signal $V_U$ is absent, a counter having first and second inputs coupled to an output of the comparator and to a clock circuit, respectively, said counter incrementing or decrementing its count depending on the polarity of the comparator output signal and in synchronism with the clock circuit signals during said recurrent time intervals, a memory having N memory locations, means coupling the memory between an output of the counter and an input of a digital-to-analog converter, the memory storing, for each value of the index i and as a function of the value of the output signal of the comparator, the digital value of the feedback signal associated with said index value, the memory retaining said digital value at least until a new comparison is made for the same value of the cyclically varying index i, means connecting an output of the memory to a third input of the counter, and means coupling an output of the digital-to-analog converter to the second input of the amplifier to supply thereto an analog negative feedback signal determined by said spurious component $V_D$.

2. A multiplier stage as claimed in claim 1 further comprising an adder circuit coupled between the output of the multiplier circuit and the first input of the amplifier, means connecting outputs of (M−1) further multiplier circuits to (M−1) further inputs of the adder circuit in a similar way, the M multiplier circuits being arranged in parallel so that each receives an electric signal at a first input, said signal comprising a useful signal component $V_{Uj}$ and a spurious component $V_{Dj}$ whose amplitutde varies at a frequency which is substantially lower than the recurrent frequency of a corresponding intermittent signal $V_{Uj}$, and a quantized signal $V_{Qij}$ at a second input, the multiplier circuits supplying the product signal $V_{Qij}(V_{Uj}+V_{Dj})$ to the corresponding inputs of the adder circuit, the indexes i and j of signals $V_{Qij}$, $V_{Uj}$ and $V_{Dj}$ respectively varying from 1 to N and from 1 to M and all the components $V_{Uj}$ being interupted at the same instant, the memory of the negative feedback circuit comprising N memory locations which each store, for the corresponding value of the index i, the digital value of the feedback signal associated with said value of the index i as a function of the value of the output signal of the comparator, and retain said digital value at least until a new comparison is made for the same value of the cyclically varying index i.

3. A transversal filter of the time-domain type comprising a network of M−1 serially connected delay lines, each having an input and an output, means coupling the output of a delay line to the input of a following delay line, a plurality of M tappings, one of said tappings being present at the input of a first delay line and the others being present at the outputs of the delay lines, a plurality of M multiplier circuits for multiplying signals available at the tappings with weighting coefficients, an adding circuit for summing the outputs of the multiplier circuits and an amplifier for amplifying an output signal of the adding circuit, characterized in that the filter comprises a multiplier stage as claimed in claim 2, in which the intermittent useful signals $V_{Uj}$ are the M signals available at tappings of the network of delay lines, and the quantized signals $V_{Qij}$ are the M weighting coefficients of the filter which, for each value of the index i, are respectively applied to the corresponding inputs of the M multiplier circuits via a digital-to-analog conversion stage for said weighting coefficients coupled between an output of a coefficient storage memory and the second inputs of the multiplier circuits.

4. A transversal filter as claimed in claim 3, characterized in that the digital to analog conversion stage for the weighting coefficients comprises M digital to analog converters arranged in parallel between outputs of the coefficient storage memory and respective second inputs of the M multiplier circuits.

5. A transversal filter as claimed in claim 4, characterized in that it comprises M second negative feedback circuits which each comprise a second comparator coupled to the output of the amplifier to enable a comparison of the output signal of said amplifier with a zero threshold value, a second counter, a second clock circuit, a second memory and a second digital-to-analog converter, that it further comprises M third negative feedback circuits which each comprise a third comparator also coupled to the output of the amplifier to enable a comparison of the output signal of said amplifier with a threshold value which is identical for all the weighting coefficients of the filter and is determined by the desired dynamic behaviour of each multiplier circuit, a third counter, a third clock circuit, a third memory and a third digital-to-analog converter, that the M digital-to-analog converters of the weighting-coefficient conversion-stage are multiplying converters each of which have a zeroing input and an analog input respectively connected to an output of the associated one of the M second feedback circuits and to an output of the associated one of the M third feedback circuits, the digital input being connected to the output of the weighting-coefficients memory and the output, at which an analog signal appears which is the product of the signals appearing at the analog and digital inputs, is connected to the second input of that one of the M multiplier circuits which is associated with said converter, and a control element for controlling the M second and the M third feedback circuits for starting the zeroing and dynamic control cycles of each of the multiplier circuits.

6. A transversal filter as claimed in claim 3, characterized in that it comprises a second and a third negative feedback circuit, respectively comprising a second and a third comparator arranged at the output of the amplifier to enable a comparison respectively with a zero threshold value and with a threshold value which is identical for all the weighting coefficients of the filter and is determined by the desired dynamic behaviour of each multiplier circuit, a second and a third counter, a second and a third clock circuit, a second and a third memory, and a second and a third digital-to-analog converter, that the conversion stage comprises a multiplying digital-to-analog converter and an interface and demultiplexing circuit, that said multiplying converter includes a zeroing input and an analog input respectively connected to the output of the second and of the third feedback circuit, a digital input connected to the output of the weighting-coefficient memory and an output, at which an analog signal appears which is the product of the signals present at the analog and digital inputs, connected to an input of the interface and demultiplexing circuit, that said interface and demultiplexing circuit comprises M outputs which are each connected to a respective second input of one of the M multiplier circuits, and a control element for controlling the second and the third feedback circuits for starting the zeroing and dynamic control cycles of each of the multiplier circuits.

7. A fast transversal filter, comprising two transversal filters each as claimed in any one of the claims 5 and 6 arranged in parallel, an adjusting cycle of one of the transversal filters being started during a normal cycle of operation of the other filter, and vice versa.

8. An amplifier circuit for amplifying a signal comprising an intermittent useful signal component $V_U$ with a given recurrent frequency and with a predetermined signal level at predetermined recurring time intervals and a spurious component $V_D$ varying in amplitude at a frequency substantially lower than said recurrent frequency comprising, an amplifier having an inverting input and a non-inverting input, an input terminal for applying said signal to one of said amplifier inputs, and a negative feedback circuit comprising:

a comparator coupled to an output of the amplifier for comparing the output signal level at predetermined recurring time intervals with a reference signal level, a counter having a first input coupled to an output of the comparator, a second input coupled to an associated clock circuit and an output, said counter being adapted to increment or decrement its count depending on the polarity of the comparator output signal and in synchronism with the clock signal of the clock circuit during said recurring time intervals, and a digital-to-analog converter coupled to the output of the counter for supplying an analog negative feedback signal determined by said spurious component $V_D$ to the other input of the amplifier.

9. An amplifier circuit as claimed in claim 8 wherein said comparator includes means for sampling the spurious component $V_D$ during predetermined recurring time intervals when the signal $V_U$ is absent.

10. An amplifier circuit as claimed in claim 8 wherein said negative feedback circuit is operative during recurring time intervals when the signal $V_U$ is absent thereby to adjust the state of the counter to a value determined only by the value of the spurious component $V_D$, the state of the counter being fixed during intervals when the signal $V_U$ is present at said input terminal of the amplifier circuit.

11. A transversal filter comprising a network of delay lines coupled in cascade and having an input for receiving an intermittent signal $V_U$ with a spurious component $V_D$ varying at a frequency lower than the recurrent frequency of the signal $V_U$, a plurality of multiplier circuits each having first and second inputs and an output, a memory for storing weighting coefficients of the filter, means coupling said first inputs of the multiplier circuits to respective tap points on the network of delay lines, a digital-to-analog conversion stage for coupling outputs of the memory to respective ones of the second inputs of the multiplier circuits to supply thereto a quantized signal $V_{Qi}$ which varies cyclically and in steps, an adder circuit having input means and an output coupled to a first input of an operational amplifier, means coupling the outputs of the multiplier circuits to said adder circuit input means, and a negative feedback circuit coupling an output of the amplifier to a second input of the operational amplifier, said negative feedback circuit comprising; a comparator coupled to the output of the amplifier for comparing the spurious component $V_D$ with a reference signal, a counter having first and second inputs coupled to an output of the comparator and to an output of a source of clock signals, respectively, said counter varying its count up or down as a function of the comparator output signal and in synchronism with the clock signals during recurrent time intervals of the signal $V_U$, a digital-to-analog converter, a memory coupled between an output of the counter and an input of the digital-to-analog converter and having a plurality of memory locations for storing digital values of the feedback signals associated with said quantized signal $V_{Qi}$ and as a function of the comparator output signals, and means coupling an output of the digital-to-analog converter to the second input of the operational amplifier for supplying thereto an analog negative feedback signal.

* * * * *